US010075187B2

(12) United States Patent
Jiang et al.

(10) Patent No.: US 10,075,187 B2
(45) Date of Patent: Sep. 11, 2018

(54) MCS/PMI/RI SELECTION AND CODING/INTERLEAVING MECHANISM FOR BURSTY INTERFERENCE AND PUNCTURING HANDLING

(71) Applicant: QUALCOMM Incorporated, San Diego, CA (US)

(72) Inventors: Jing Jiang, San Diego, CA (US); Tingfang Ji, San Diego, CA (US); Joseph Binamira Soriaga, San Diego, CA (US); Peter Gaal, San Diego, CA (US); Alexei Yurievitch Gorokhov, San Diego, CA (US); Kambiz Azarian Yazdi, San Diego, CA (US); John Edward Smee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 24 days.

(21) Appl. No.: 14/942,265

(22) Filed: Nov. 16, 2015

(65) Prior Publication Data

US 2016/0269047 A1    Sep. 15, 2016

Related U.S. Application Data

(60) Provisional application No. 62/133,430, filed on Mar. 15, 2015.

(51) Int. Cl.
*H03M 13/03* (2006.01)
*H03M 13/27* (2006.01)
(Continued)

(52) U.S. Cl.
CPC ......... *H03M 13/27* (2013.01); *H03M 13/353* (2013.01); *H04L 1/0015* (2013.01);
(Continued)

(58) Field of Classification Search
CPC ............... H03M 13/27; H03M 13/353; H03M 13/1102; H03M 13/2957; H04L 1/0015;
(Continued)

(56) References Cited

U.S. PATENT DOCUMENTS

| 6,684,366 | B1 * | 1/2004 | Trott | H04L 1/1819 |
| | | | | 714/751 |
| 2001/0016931 | A1 * | 8/2001 | Mottier | H03M 13/23 |
| | | | | 714/790 |

(Continued)

FOREIGN PATENT DOCUMENTS

WO    WO-2016060895 A2    4/2016

OTHER PUBLICATIONS

ISA/EPO, International Search Report and Written Opinion of the International Searching Authority, Int'l. App. No. PCT/US2016/020975, dated Jun. 13, 2016, European Patent Office, Rijswijk, NL, 14 pgs.

*Primary Examiner* — Thien Nguyen
(74) *Attorney, Agent, or Firm* — Clint R. Morin; Holland & Hart

(57) ABSTRACT

Bursty interference or puncturing may be identified, either by a user equipment (UE) or by a base station. In response, a protection scheme may be applied to protect communications from the bursty interference or puncturing. The protection scheme may include using both time and frequency interleaving of code blocks in the communications. The protection scheme may also include modifying the modulation and coding scheme (MCS), coding rate, precoding matrix index (PMI), or rank indicator (RI) used in the communications. The protection scheme may also include using a universal low-density parity check (LDPC) code in the transmission of the communications.

28 Claims, 12 Drawing Sheets

(51) Int. Cl.
　　　*H04L 1/00*　　　(2006.01)
　　　*H03M 13/35*　　(2006.01)
　　　*H03M 13/11*　　(2006.01)
　　　*H03M 13/29*　　(2006.01)
(52) U.S. Cl.
　　　CPC .... *H03M 13/1102* (2013.01); *H03M 13/2957* (2013.01); *H04L 1/0003* (2013.01); *H04L 1/0009* (2013.01); *H04L 1/0023* (2013.01); *H04L 1/0071* (2013.01)
(58) Field of Classification Search
　　　CPC ... H04L 1/0071; H04L 1/0009; H04L 1/0023; H04L 1/0003
　　　See application file for complete search history.

(56) References Cited

U.S. PATENT DOCUMENTS

| | | | |
|---|---|---|---|
| 2004/0213187 A1* | 10/2004 | Fujil | H04B 7/0408 370/335 |
| 2005/0003756 A1* | 1/2005 | Sun | H03M 13/1102 455/3.01 |
| 2005/0073973 A1* | 4/2005 | Laroia | H04L 1/007 370/329 |
| 2007/0234186 A1* | 10/2007 | Mo | H03M 13/23 714/790 |
| 2010/0067367 A1* | 3/2010 | Choi | H04L 5/0064 370/210 |
| 2011/0267966 A1* | 11/2011 | Gao | H04W 28/22 370/252 |
| 2012/0135778 A1* | 5/2012 | Tian | H04L 1/0003 455/522 |
| 2013/0033989 A1* | 2/2013 | Barbieri | H04L 1/0003 370/242 |
| 2013/0315198 A1* | 11/2013 | Krishna Kumar | H04L 1/0009 370/330 |
| 2015/0067435 A1* | 3/2015 | Yerramalli | H04L 1/0006 714/748 |
| 2015/0146827 A1* | 5/2015 | Ohana | H04L 1/0054 375/341 |

* cited by examiner

MCS/PMI/RI SELECTION AND CODING/INTERLEAVING MECHANISM FOR BURSTY INTERFERENCE AND PUNCTURING HANDLING

CROSS REFERENCES

The present application for Patent claims priority to U.S. Provisional Patent Application No. 62/133,430 by Jiang et al., entitled "MCS Selection and Coding/Interleaving Mechanism for Bursty Interference and Puncturing Handling," filed Mar. 15, 2015, assigned to the assignee hereof.

BACKGROUND

Field of the Disclosure

The present disclosure, for example, relates to wireless communication systems, and more particularly to protecting wireless communications from bursty interference or puncturing.

Description of Related Art

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

By way of example, a wireless multiple-access communication system may include a number of base stations, each simultaneously supporting communication for multiple communication devices, otherwise known as user equipments (UEs). A base station may communicate with UEs on downlink channels (e.g., for transmissions from a base station to a UE) and uplink channels (e.g., for transmissions from a UE to a base station). A base station communicating with a UE may be referred to as a serving base station, while other nearby base stations may be referred to as neighbor base stations.

Communication between a UE and a base station may, however, be negatively affected by bursty interference or by puncturing. At times, a serving base station may puncture an ongoing communication with a UE in order to provide sufficient communication resources for other low latency or mission critical communications. Additionally, bursty communications involving a neighboring base station could result in interference in communications between a UE and a serving base station. Even bursty communications over unrelated networks may result in interference in communications between a UE and a serving base station.

SUMMARY

The adverse effects of bursty interference or puncturing may be protected against by enacting a scheme to protect communications that may be subject to bursty interference or puncturing. When bursty interference or puncturing is identified, either by a user equipment (UE) or a base station, a protection scheme may be enacted to protect the communications. This may include using both time and frequency interleaving of code blocks in the communications. This may also include modifying the modulation and coding scheme (MCS), coding rate, precoding matrix index (PMI), or rank indicator (RI) used in the communications. The protection scheme may also include using a universal low-density parity check (LDPC) code in the transmission of the communications.

In a first set of illustrative embodiments, a method for wireless communication is described. The method may include identifying bursty interference or puncturing in one or more code blocks of a first transport block (TB), and determining a protection scheme, based at least in part on the identified bursty interference or puncturing, to apply to TBs to address bursty interference or puncturing on the TBs.

In some embodiments, the method may include identifying bursty interference or puncturing via base station analysis and signaling or via UE detection. The method may also include applying, as the protection scheme, time and frequency interleaving of code blocks of TBs in response to bursty puncturing from mission critical low latency users of a same serving base station or in response to bursty interference from mission critical low latency users of neighbor base stations or neighbor shared spectrum wireless networks. The method may also include applying, as the protection scheme, time and frequency interleaving of code blocks of the TBs in the presence of bursty interference or puncturing.

In some embodiments, the method may include applying to the TBs, as the protection scheme, a second combination of MCS and coding rate that is different from a first combination of MCS and coding rate applied to TBs in non-bursty interference or puncturing environments. The method may also include using, as the protection scheme, a universal LDPC code in the transmission of the TBs, wherein coded patterns of bits of the LDPC code are less susceptible to puncturing than are systematic bits of turbo code.

In some examples, the method may include providing channel state information (CSI) associated with a first transmission of the first TB to a serving base station, the CSI including at least spectrum efficiency, or a bursty puncturing duty cycle, or an interference level, or a combination thereof. Alternatively, the method may include receiving CSI associated with a first transmission of the first TB from a UE, the CSI including at least spectrum efficiency, or a bursty puncturing duty cycle, or an interference level, or a combination thereof. The method may further include applying to a second or later transmission of the TBs, based at least in part on the CSI, a second combination of MCS and coding rate that is different from a first combination of MCS and coding rate applied to the first TB, the protection scheme comprising the second combination of MCS and coding rate. Additionally, the method may include generating an instantaneous CSI data based at least in part on the CSI associated with a transmission of the first TB, and applying the second combination of MCS and coding rate to subsequent retransmission TBs based at least in part on the instantaneous CSI data associated with the first transmission of the first TB.

In some aspects, the method may include applying to the TBs in the presence of bursty interference or puncturing, as the protection scheme, a second combination of MCS and coding rate that is different from a first combination of MCS and coding rate applied to the TBs in the absence of bursty interference or puncturing, wherein a modulation of the second combination is higher order than a modulation of the first combination, and wherein the coding rate of the second combination is lower than a coding rate of the first combination. The method may also include applying to the TBs in the presence of bursty interference or puncturing, as the protection scheme, a second rank index (RI) that is higher than a first RI applied to the TBs in the absence of bursty interference or puncturing. The method may further include applying to the TBs in the presence of bursty interference or puncturing, as the protection scheme, a second precoding matrix indicator (PMI) that is different from a first PMI applied to the TBs in the absence of bursty interference or puncturing, wherein the second PMI results in a lower coding rate of the subsequent TBs relative to a coding rate of the first TB.

In some aspects, the method may include using the protection scheme to protect the one or more code blocks of the first TB during retransmission to compensate for loss due to large-scale bursty interference or puncturing. The method may further include retransmitting less than all of the first TB to compensate for small-scale bursty interference or puncturing. Identifying bursty interference or puncturing in one or more code blocks of a first TB may include determining that low latency communications from a serving base station are puncturing the first TB via base station signaling or UE detection.

In a second set of illustrative examples, an apparatus for wireless communication is described. The apparatus may include means for identifying bursty interference or puncturing in one or more code blocks of a first TB, and means for determining a protection scheme, based at least in part on the identified bursty interference or puncturing, to apply to TBs to address bursty interference or puncturing on the TBs. In some examples, the apparatus may further include means for implementing one or more aspects of the method for wireless communication described above with respect to the first set of illustrative examples.

In a third set of illustrative examples, another apparatus for wireless communication is described. The apparatus may include a processor, memory in electronic communication with the processor, and instructions stored in the memory. The instructions may be executable by the processor to identify bursty interference or puncturing in one or more code blocks of a first TB, and to determine a protection scheme, based at least in part on the identified bursty interference or puncturing, to apply to TBs to address bursty interference or puncturing on the TBs. In some examples, the instructions may also be executable by the processor to implement one or more aspects of the method for wireless communication described above with respect to the first set of illustrative examples.

In a fourth set of illustrative examples, a non-transitory computer-readable medium storing computer-executable code for wireless communication is described. The code may be executable by a processor to identify bursty interference or puncturing in one or more code blocks of a first TB. The code may also be executable by a processor to determine a protection scheme, based at least in part on the identified bursty interference or puncturing, to apply to TBs to address bursty interference or puncturing on the TBs. In some examples, the code may also be used to implement one or more aspects of the method for wireless communication described above with respect to the first set of illustrative examples.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
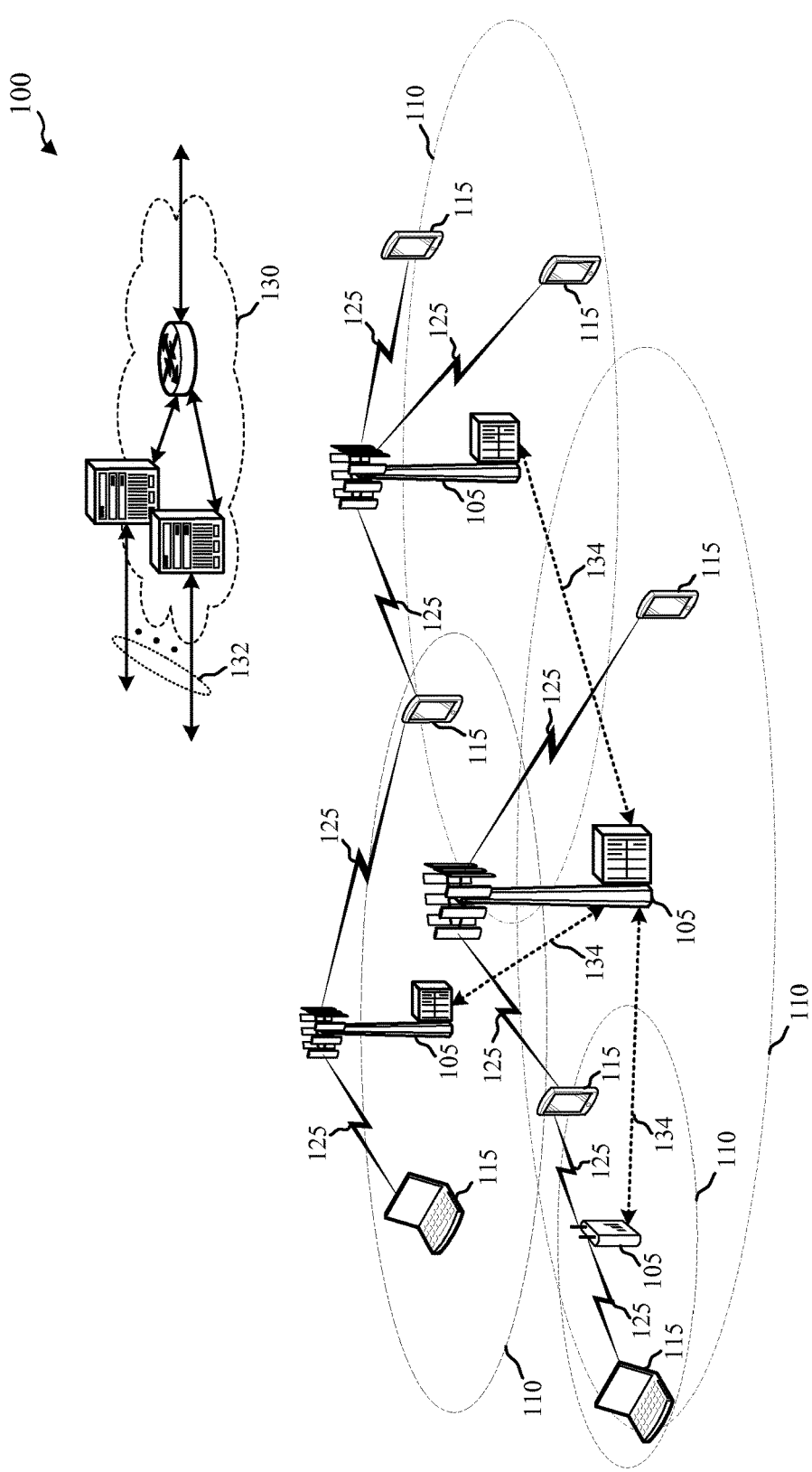
FIG. 1 shows a wireless communication system, in accordance with various aspects of the present disclosure.

Communications between a base station and a user equipment (UE) may be adversely affected by bursty interference or puncturing. For example, a downlink (DL) or uplink (UL) communication between a base station and a UE may occur during a transmission time interval (TTI). A single transport block (TB) may be transmitted during the TTI. The TB may include one or more code blocks (CBs). The TB, with its one or more CBs, may be transmitted in a way to protect against some types of interference (for example, nominal noise such as additive white Gaussian noise (AWGN)). However, in traditional Long-Term Evolution (LTE) wireless communication systems, if a TB is punctured or subject to bursty interference such that one or more CBs are skipped or rendered useless, the entire affected TB is retransmitted. Therefore, wireless communication systems may benefit from a more robust method of protecting wireless communications from bursty interference or puncturing. Benefits of such improved protection may include fewer and smaller retransmissions of affected communications, for example.

Improved schemes for protecting against bursty interference and puncturing may include applying both time domain and frequency domain interleaving of each CB in a TB. In traditional LTE, very little time domain interleaving may be applied to CBs. However, by applying two-dimensional time-frequency interleaving of each CB, CBs become more robust to bursty interference and puncturing. Time domain and frequency domain interleaving may be applied to all TBs when bursty interference or puncturing is present. Another improved scheme for protecting against bursty interference and puncturing may include applying different combinations of modulation and coding schemes (MCSs) and coding rates to different communications based on, at least in part, whether bursty interference or puncturing is expected. In general, a combination of high modulation and low coding rate may be beneficial in combating bursty interference or puncturing. This may be in contrast to a use of low modulation and moderate coding rate to combat stationary interference. Another improved scheme for protecting against bursty interference and puncturing may include the use of universal low-density parity check (LDPC) code in place of turbo code. Turbo code is typically used in traditional LTE systems. However, turbo code performance may be sensitive to puncturing, especially when a redundancy value (RV) may be set to zero and puncturing occurs in coded systematic bits. The use of universal LDPC code, however, may overcome these disadvantages of turbo code.

The improved schemes for protecting against bursty interference and puncturing may be used at a link level of communications, allowing for application of protection schemes to TBs that follow a first TB in which the bursty interference or puncturing was identified. Therefore, both stationary interference and bursty interference or puncturing may be monitored, with protection schemes being applied based on the detected types of interference.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

FIG. 1 illustrates an example of a wireless communications system 100 in accordance with various aspects of the disclosure. The wireless communications system 100 includes base stations 105, UEs 115, and a core network 130. The core network 130 may provide user authentication, access authorization, tracking, Internet Protocol (IP) connectivity, and other access, routing, or mobility functions. The base stations 105 interface with the core network 130 through backhaul links 132 (e.g., S1, etc.) and may perform radio configuration and scheduling for communication with the UEs 115, or may operate under the control of a base station controller (not shown). In various examples, the base stations 105 may communicate, either directly or indirectly (e.g., through core network 130), with each other over backhaul links 134 (e.g., X1, X2, etc.), which may be wired or wireless communication links.

The base stations 105 may wirelessly communicate with the UEs 115 via one or more base station antennas. Each of the base station 105 sites may provide communication coverage for a respective geographic coverage area 110. In some examples, base stations 105 may be referred to as a base transceiver station, a radio base station, an access point, a radio transceiver, a NodeB, eNodeB (eNB), Home NodeB, a Home eNodeB, or some other suitable terminology. The geographic coverage area 110 for a base station 105 may be divided into sectors making up only a portion of the coverage area (not shown). The wireless communications system 100 may include base stations 105 of different types (e.g., macro and/or small cell base stations). There may be overlapping geographic coverage areas 110 for different technologies.

In some examples, the wireless communications system 100 is an LTE/LTE-Advanced (LTE-A) network. In LTE/LTE-A networks, the term evolved Node B (eNB) may be generally used to describe the base stations 105, while the term UE may be generally used to describe the UEs 115. The wireless communications system 100 may be a Heterogeneous LTE/LTE-A network in which different types of eNBs provide coverage for various geographical regions. For example, each eNB or base station 105 may provide communication coverage for a macro cell, a small cell, and/or other types of cell. The term "cell" is a 3GPP term that can be used to describe a base station, a carrier or component carrier associated with a base station, or a coverage area (e.g., sector, etc.) of a carrier or base station, depending on context.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell may cover a relatively smaller geographic area and may allow unrestricted access by UEs with service subscriptions with the network provider. A femto cell also may cover a relatively small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB or a home eNB. An eNB may support one or multiple (e.g., two, three, four, and the like) cells (e.g., component carriers).

The wireless communications system 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The communication networks that may accommodate some of the various disclosed examples may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use Hybrid ARQ (HARM) to provide retransmission at the MAC layer to improve link efficiency. In the control plane, the Radio Resource Control (RRC) protocol layer may provide establishment, configuration, and maintenance of an RRC connection between a UE 115 and the base stations 105 or core network 130 supporting radio bearers for the user plane data. At the Physical (PHY) layer, the transport channels may be mapped to Physical channels.

The UEs 115 are dispersed throughout the wireless communications system 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with various types of base stations and network equipment including macro eNBs, small cell eNBs, relay base stations, and the like.

The communication links 125 shown in wireless communications system 100 may include UL transmissions from a UE 115 to a base station 105, and/or DL transmissions, from a base station 105 to a UE 115. The DL transmissions may also be called forward link transmissions while the UL transmissions may also be called reverse link transmissions. Each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using FDD (e.g., using paired spectrum resources) or TDD operation (e.g., using unpaired spectrum resources). Frame structures for FDD (e.g., frame structure type 1) and TDD (e.g., frame structure type 2) may be defined.

In some embodiments of the system 100, base stations 105 and/or UEs 115 may include multiple antennas for employing antenna diversity schemes to improve communication quality and reliability between base stations 105 and UEs 115. Additionally or alternatively, base stations 105 and/or UEs 115 may employ multiple-input, multiple-output (MIMO) techniques that may take advantage of multi-path environments to transmit multiple spatial layers carrying the same or different coded data.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

While communications between a UE 115 and a base station 105 via communication link 125 are often coded so as to tolerate some level of noise or interference, bursty interference or puncturing may result in communication losses that may require a significant amount of resources to be used for retransmission of the otherwise lost communications. Unfortunately, in traditional LTE systems, retransmission occurs at the TB level and not at the CB level, meaning that even if only one CB is punctured or otherwise rendered unusable, the entire TB is retransmitted. Puncturing and bursty interference may sometimes affect only a small amount of CBs within a TB. Therefore, improving methods for protecting communications against puncturing or bursty interference may significantly reduce the amount of resources needed for retransmissions.

Improvements over traditional LTE systems may be included in so-called 5G systems. Whereas in traditional LTE systems, there may be very little time domain interleaving of CBs in large TBs (with one CB occupying one symbol, for example), in 5G systems, both time domain and frequency domain interleaving of individual CBs may be accomplished, thus improving the interference diversity of the CBs. Whereas in traditional LTE systems, retransmission was at the TB level instead of at the CB level, in 5G systems, individual CBs punctured or lost due to bursty interference may be recovered without retransmission of an entire TB. For example, a MAC layer forward error correction (FEC) signal and HARQ signal may be used to recover CBs punctured in favor of mission critical or low latency traffic. Whereas in traditional LTE systems, a UE 115 would generally be unaware of mission critical puncturing or turbo code performance sensitivity to RV equal to zero puncturing, in 5G, UEs 115 may be informed of puncturing through indicator channels and through better LDPC code design and application.

Figure 2A:
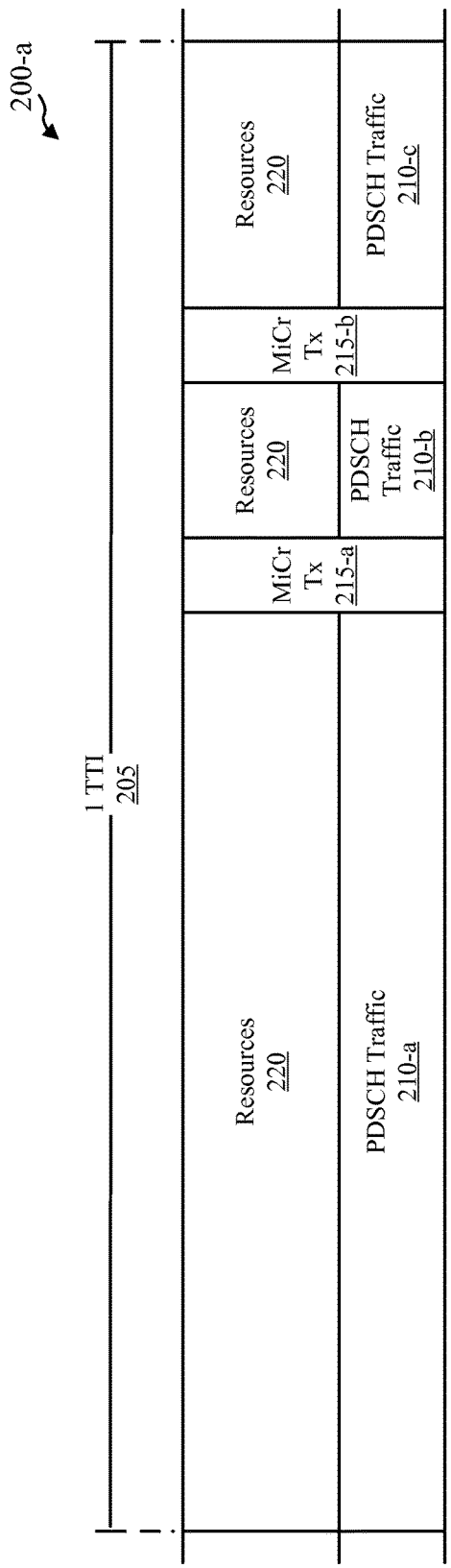
FIGS. 2A and 2B show example data streams subject to puncturing, in accordance with various aspects of the present disclosure.

FIG. 2A illustrates an example of a data stream 200-a that is subject to puncturing. The data stream 200-a includes a TTI 205 during which resources 220 are available for transmission. In the example, the TTI 205 includes physical downlink shared channel (PDSCH) traffic 210, which may include a data transmission from a serving base station 105—to a UE 115. However, in this example, the serving base station 105 determines that certain mission critical transmissions 215 (which may be low latency communications, for example) may require the use of resources assigned to the PDSCH traffic 210. Therefore, after a transmission of an initial portion of the PDSCH traffic 210-a, a mission critical transmission 215-a punctures the PDSCH traffic 210. The remaining portions of the PDSCH traffic 210-b, 210-c are again punctured by a second mission critical transmission 215-b. Thus, in the example of FIG. 2A, any CBs lost due to the puncturing of the PDSCH traffic 210 may need to be retransmitted if the UE 115 is to receive them.

Figure 2B:
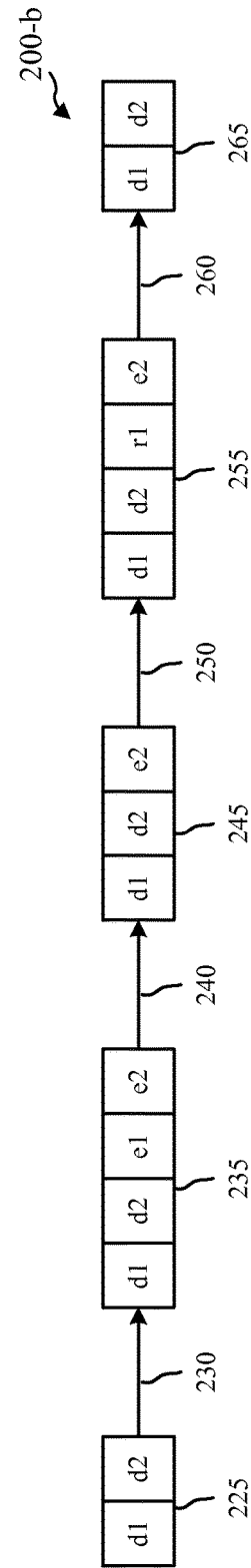

FIG. 2B illustrates another data stream 200-b that is subject to puncturing. FIG. 2B also illustrates the application of a coding rate to data stream 200-b to attempt to combat the effects of puncturing. In FIG. 2B, a two-bit symbol 225 is to be transmitted from a base station 105 to a UE 115. The two-bit symbol 225 includes bits d1 and d2. In anticipation of noise, interference or puncturing, the two-bit symbol 225 is encoded 230 using a 1/2 coding rate. This means that for every original bit, an additional error correcting code (ECC) bit is added. Therefore, when the two-bit symbol 225 is encoded 230 using a 1/2 coding rate, a four-bit symbol 235 results. the four-bit symbol 235 includes original bits d1 and d2, and also EEC bits e1 and e2. During transmission 240, however, one or more bits may be punctured. FIG. 2B illustrates a punctured word 245 that includes original bits d1 and d2 and EEC bit e2. Upon receipt 250, the UE 115 may insert random bits to form a reconstructed symbol 255 that includes original bits d1 and d2, EEC bit e2, and random bit r1. The reconstructed symbol 255 is then decoded 260 to result in a received symbol 265 that includes the original bits d1 and d2.

Despite the fact that the transmitted symbol in FIG. 2B was subject to puncturing, the use of a 1/2 coding rate allowed for the preservation of data when the symbol was received at a UE 115. Thus, in the example of FIG. 2B, the use of a coding rate less than one helped to protect the transmitted data. In general, the lower the coding rate, the more robust the communication will be to puncturing or bursty interference.

Figure 3:
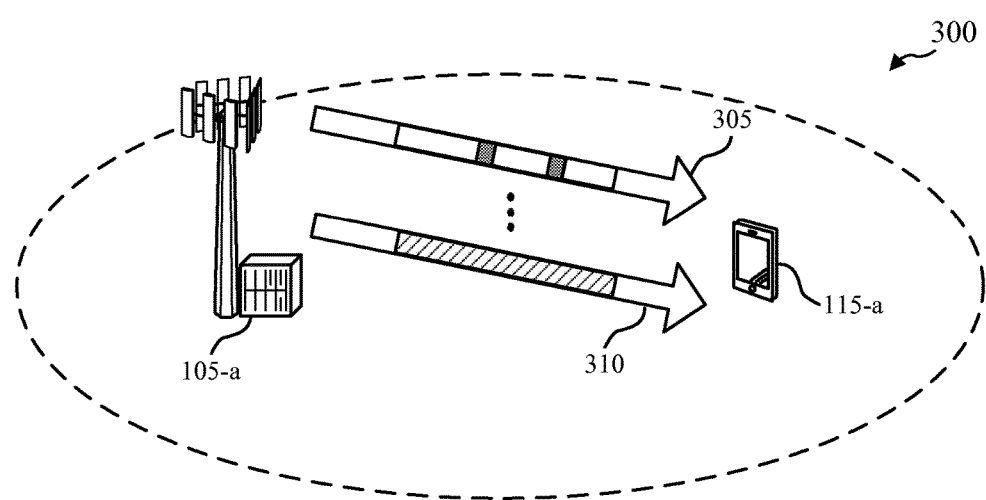
FIG. 3 shows a wireless communication system implementing a bursty interference and puncturing protection scheme, in accordance with various aspects of the present disclosure.

FIG. 3 shows a wireless communications system 300 implementing a bursty interference and puncturing protection scheme that builds upon some of the ideas discussed in relation to FIGS. 2A and 2B. Wireless communications system 300 may include UE 115-a and base station 105-a, which may be examples of a UE 115 or a base station 105 described above with reference to FIG. 1. Base station 105-a and UE 115-a may communicate with one another via downlink 305 when UE 115-a is within coverage area 110-a, as generally described above with reference to FIG. 1.

For example, downlink 305 may be used to communicate a TB from the base station 105-a to the UE 115-a. The TB may include one or more CBs. As was illustrated in FIG. 2A, one or more of the CBs may be punctured. Puncturing of CBs may occur when the base station 105-a is multiplexing both mission critical traffic and nominal traffic. Thus, downlink 305 may be used to send nominal traffic from the base station 105-a to the UE 115-a, but the base station 105-a may also use resources assigned to the downlink 305 for mission critical traffic, thereby puncturing the TB. Additionally or alternatively, one or more of the CBs transmitted on the downlink 305 may be rendered unusable by bursty interference. Bursty interference could occur when, for example, a neighboring base station is engaging in mission critical communications. Bursty interference could also occur when, for example, bursty communications occur on neighboring but unrelated networks, such as on an unlicensed spectrum network (e.g., WiFi).

In response to the puncturing or bursty interference, the base station 105-a may apply a protection scheme to TBs transmitted via downlink 310. The protection scheme may include the use of time and frequency interleaving of CBs in the transmitted TBs. The protection scheme may include varying the MCS and coding rates applied to the transmitted TBs. Additionally, the protection scheme may include the use of LDPC code in place of turbo code. The base station 105-a may inform UE 115-a of puncturing through indicator channels and through the LDPC code. Further, the UE 115-a may use FEC and HARQ to recover CBs punctured by mission critical traffic, without the need for retransmission of entire TBs.

Figure 4:
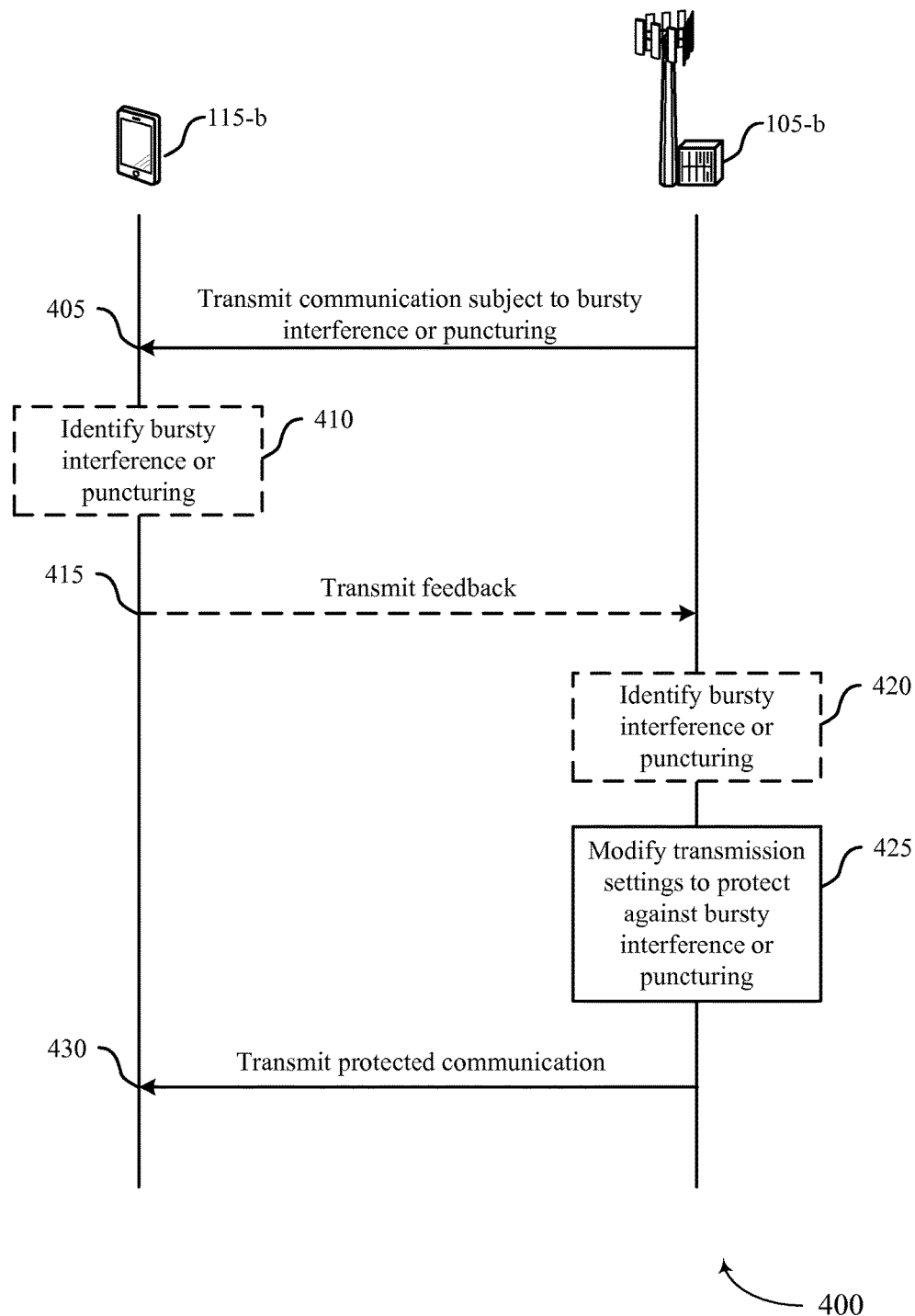
FIG. 4 shows a wireless communication process flow implementing a bursty interference and puncturing protection scheme, in accordance with various aspects of the present disclosure.

FIG. 4 illustrates an example process flow 400 for wireless communications that may include protecting communications against puncturing or bursty interference. Process flow 400 may be performed by UE 115-b and base station 105-b which may be examples of a UE 115 or base station 105 as described above with reference to FIGS. 1-3. In some examples, process flow 400 illustrates an option where the UE 115-b receives a communication that has been subject to bursty interference or puncturing.

At step 405 of process flow 400, the base station 105-b transmits a communication to the UE 115-b. As illustrated in FIG. 2A, the communication may be a PDSCH transmission, for example. The communication may, however, be subject to bursty interference or puncturing. The puncturing may be the result of the base station 105-b engaging in mission critical communications. The bursty interference may be the result of neighboring base stations or networks engaging in bursty communications. The bursty interference or puncturing may result in one or more CBs of the transmitted communication being lost or otherwise rendered unusable.

At step 410, the UE 115-b may identify the bursty interference or puncturing. Identification of the bursty interference or puncturing need not occur at the UE 115-b (it may also occur at the base station 105-b), but it can. If the UE 115-b identifies that a received communication has been subject to bursty interference or puncturing, the UE 115-b may transmit feedback to the base station 105-b (at step 415). The feedback may be in the form of channel state information (CSI), for example. The feedback may also be in the form of FEC and HARQ transmissions. The feedback may indicate to the base station 105-b that certain CBs were not received or were unusable, and may include a request for retransmission of those CBs. The feedback may also indicate various CSI metrics, including spectrum efficiency, bursty puncturing duty cycle, and/or interference level. Other feedback information may also be transmitted from the UE 115-b to the base station 105-b at step 415.

At step 420, the base station 105-b may identify bursty interference or puncturing. The base station 105-b may identify the bursty interference or puncturing by receiving feedback transmitted by the UE 115-b at step 415. Alternative or in addition, the base station 105-b may identify bursty interference or puncturing through its own analysis. For example, if the base station 105-b is engaged in multiplexing of nominal communications and mission critical communications, the base station 105-b may be aware of puncturing that may be occurring in its communications with UE 115-b.

At step 425, the base station 105-b may modify transmission settings to protect against bursty interference or puncturing. This modification may come in many forms. In one protection scheme, the base station 105-b may apply two-dimensional interleaving (in both the time domain and frequency domain) of CBs transmitted in communications to the UE 115-b. The use of the two-dimensional interleaving may be in response to the identification of bursty interference or puncturing. In other words, two-dimensional interleaving of the CBs may not be applied if no bursty interference or puncturing is detected.

Another protection scheme that may be applied is the use of different MCS and coding rates for transmitted TBs. The combination of MCS and coding rate applied to a communication may be based on whether the communication is subject to bursty interference or puncturing. For example, if a communication is subject to stationary interference only (such as AWGN interference), a low modulation and moderate coding rate may be used in order to provide sufficient protection and to maintain spectrum efficiency. For example, if the signal-to-noise ratio (SNR) in a communication subject to AWGN interference is approximately 5 dB, and if there is no puncturing and the spectrum efficiency is approximately 2 bits/sec/Hz, then a preferred MCS may include a quadrature amplitude modulation (QAM) of 16QAM, and a preferred coding rate may be 1/2. However, if both AWGN interference and bursty mission critical puncturing is detected, the preferred MCS and coding rate may vary. For example, if the SNR for a communication subject to both AWGN and puncturing is 12.5 dB, if the puncturing rate is approximately 50%, and the spectrum efficiency is approximately 2 bits/sec/Hz, then the preferred modulation may be 256QAM, and a preferred coding rate may be 1/4. Therefore, a combination of a low modulation and a moderate coding rate may be used to protect against stationary interference, while a combination of a high modulation and low coding rate may be used to protect against puncturing or bursty interference.

Other parameters may be varied as well in order to result in a lower overall coding rate when puncturing or bursty interference is present. For example, a different rank index (RI) may be applied to protect against puncturing or bursty interference. A different RI may provide better spatial diversity or spatial nulling, such as to combat puncturing or bursty interference. Additionally, a pre-coding matrix indicator (PMI) may be varied so as to also result in a higher overall nominal data spectrum efficiency in the presence of bursty interference (such as for mission critical data) or puncturing (by better spatial nulling, interference rejection, etc.).

Another protection scheme that may be applied by the base station 105-*b* may include the use of LDPC code in place of turbo code. As explained above, turbo code (and in particular, parallel concatenated turbo code) may be sensitive to systematic bit puncturing and jamming. This sensitivity is well-known and can even, in some cases, be catastrophic. However, LDPC code is already known for allowing greater efficiencies in computations per bit and for scaling up to higher data rates. Universal LDPC code may also improve jamming resilience. Therefore, the base station 105-*b* may use LDPC code in place of turbo code in transmitted TBs when bursty interference or puncturing is detected.

At step 430, the base station 105-*b* may transmit protected communications to the UE 115-*b*. The protected communications may be a retransmission of specifically-requested CBs that were not decoded by the UE 115-*b* (due to the puncturing or bursty interference). Alternatively, the protected communications may be include other TBs that are protected (using one or more of the protection schemes applied by the base station 105-*b*) based on the identification of bursty interference or puncturing.

The application of protection schemes to the communications may be based on a collection of historic information or may be based primarily on the most recently identified bursty interference or puncturing. In other words, the base station 105-*b* may provide link-level adaptation based on separate tracking of stationary interference and bursty interference or puncturing. When stationary interference is identified, the base station 105-*b* may apply, for example, a low modulation and moderate coding rate. The selection and application of the MCS and coding rate may be based on long-term averages of spectrum efficiencies and other data collected when stationary interference was detected. On the other hand, when bursty interference or puncturing is identified, the base station 105-*b* may apply, for example, a high modulation and low coding rate. The selection and application of the MCS and coding rate may also be based on long-term averages of spectrum efficiencies and data collected when bursty interference or puncturing was detected. However, the selection and application of the MCS and coding rate may also be based on the instantaneously identified bursty interference and puncturing data, as reported in the CSI or HARQ feedback, for example, received from UE 115-*b*. Similarly, PMI/RI selection may be based on long term statistics or instantaneous feedback from transmitted TBs.

Figure 5:
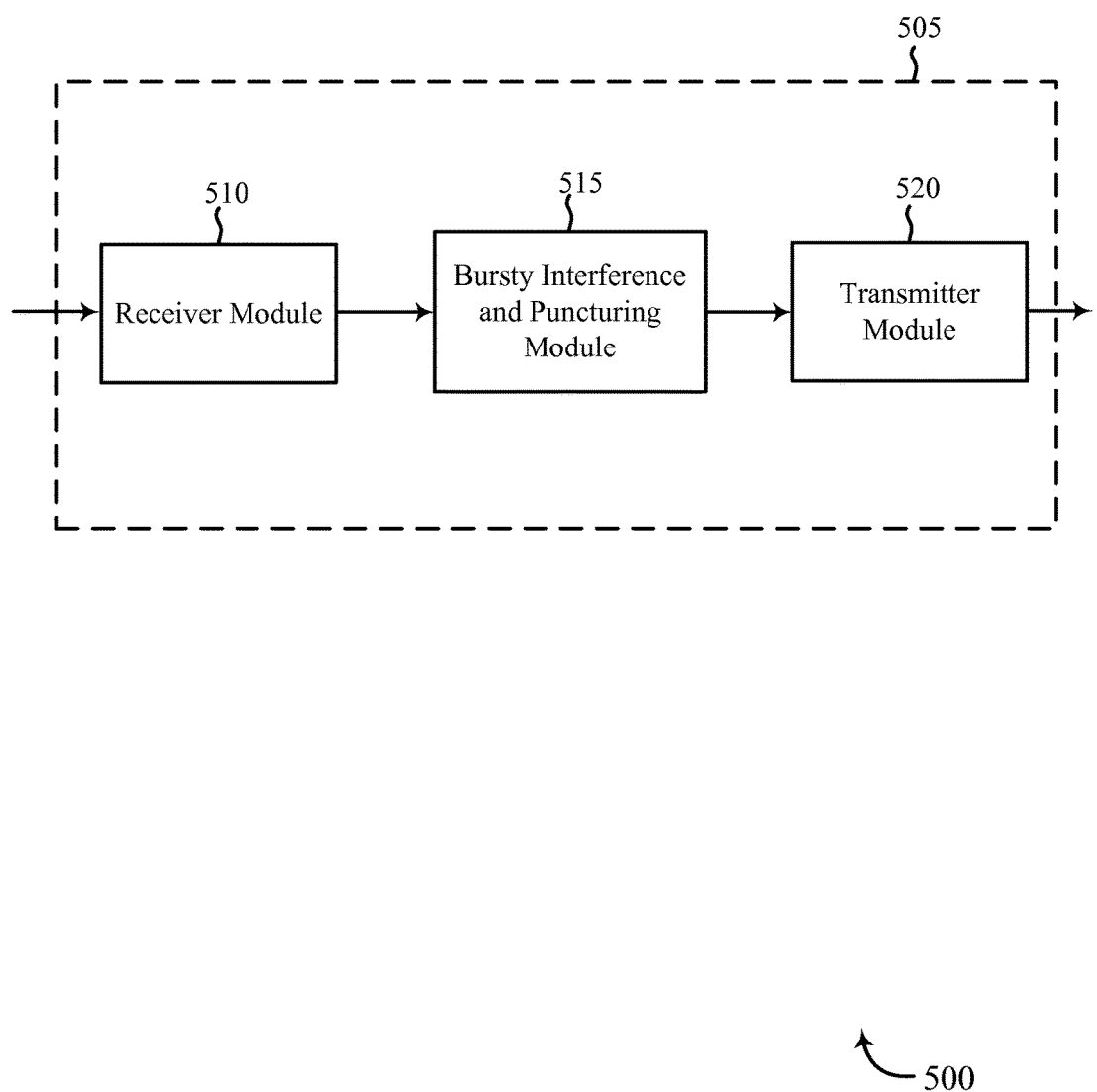
FIGS. 5 and 6 show block diagrams of a device configured for use in wireless communication, in accordance with various aspects of the present disclosure.

FIG. 5 shows a block diagram 500 of a device 505 for use in wireless communication, in accordance with various aspects of the present disclosure. The device 505 may be an example of one or more aspects of a UE 115 described with reference to FIGS. 1-4, or may alternatively be an example of one or more aspects of a base station 105 described with reference to FIGS. 1-4. The device 505 may include a receiver module 510, a bursty interference and puncturing module 515, and/or a transmitter module 520. The device 505 may also be or include a processor (not shown). Each of these modules may be in communication with each other.

The components of the device 505 may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented, in whole or in part, with instructions embodied in a memory, formatted to be executed by one or more general or application-specific processors.

The receiver module 510 may receive information such as packets, user data, and/or control information associated with various information channels (e.g., control channels, data channels, etc.). When the device 505 is configured as a UE, the receiver module 510 may be configured to receive communications that may be subject to bursty interference or puncturing. The receiver module 510 may also be configured to receive communications that are protected against bursty interference or puncturing. When the device 505 is configured as a base station, the receiver module 510 may be configured to receive feedback information from a UE that has received communications subject to bursty interference or puncturing. The feedback information may be in the form of CSI or FEC and HARQ signals. Information received by the receiver module 510 may be passed on to the bursty interference and puncturing module 515, and to other components of the device 505.

The bursty interference and puncturing module 515 may be used by the device 505 to identify bursty interference or puncturing in communications and/or to apply protection schemes to communications to protect against bursty interference or puncturing. When the device 505 is configured as a UE, the bursty interference and puncturing module 515 may be configured to identify received communications that have been subject to bursty interference or puncturing. The bursty interference and puncturing module 515 may also be configured to provide feedback to a serving base station regarding the detected bursty interference or puncturing. The feedback may be in the form of CSI or FEC and HARQ signals. When the device 505 is configured as a base station, the bursty interference and puncturing module 515 may be configured to identify transmitted communications that have been subject to bursty interference or puncturing. The identification may be through the base station's own analysis efforts, or may be through receipt of feedback information from a UE. The bursty interference and puncturing module 515 may also be configured to apply a protection scheme to communications based on the identified bursty interference or puncturing.

The transmitter module 520 may transmit the one or more signals received from other components of the device 505. When the device 505 is configured as a UE, the transmitter module 520 may transmit feedback information, such as CSI or FEC and HARQ signals, to a serving base station. When the device 505 is configured as a base station, the transmitter module 520 may transmit communications such as PDSCH traffic to a UE. The transmitted communications may be subject to bursty interference or puncturing. The transmitted communications may also be protected against bursty interference or puncturing by use of a protection scheme applied by the bursty interference and puncturing module 515. In some examples, the transmitter module 520 may be collocated with the receiver module 510 in a transceiver module.

Figure 6:
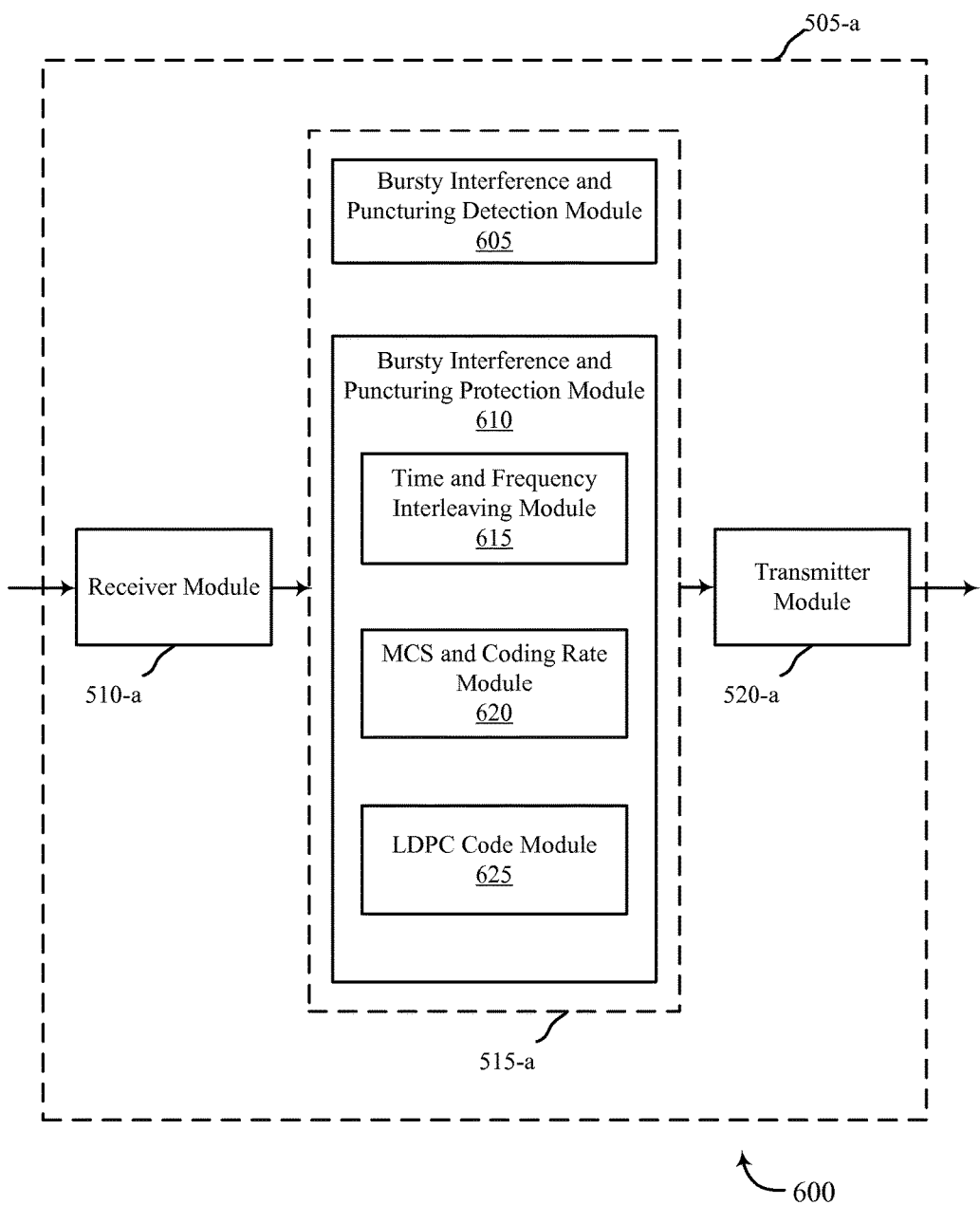

FIG. 6 shows a block diagram 600 of a device 505-a for use in wireless communication, in accordance with various examples. In some embodiments, the device 505-a may be an example of one or more aspects of a UE 115 described with reference to FIGS. 1-4. In other embodiments, the device 505-a may be an example of one or more aspects of a base station 105 described with reference to FIGS. 1-4. Device 505-a may also be an example of a device 505 described with reference to FIG. 5. The device 505-a may include a receiver module 510-a, a bursty interference and puncturing module 515-a, and/or a transmitter module 520-a, which may be examples of the corresponding modules of device 505. The device 505-a may also include a processor (not shown). Each of these components may be in communication with each other. The bursty interference and puncturing module 515-a may include a bursty interference and puncturing detection module 605 and/or a bursty interference and puncturing protection module 610. The bursty interference and puncturing protection module 610 may further include a time and frequency interleaving module 615, an MCS and coding rate module 620, and an LDPC code module 625. The receiver module 510-a and the transmitter module 520-a may perform the functions of the receiver module 510 and the transmitter module 520, of FIG. 5, respectively.

The bursty interference and puncturing detection module 605 may be used by the device 505-a to detect whether a communication is subject to bursty interference or puncturing. When the device 505-a is configured as a UE (or part of a UE), the bursty interference and puncturing detection module 605 may be used to identify that one or more CBs in a received communication have been lost or otherwise rendered unusable due to puncturing or bursty interference. When the device 505-a is configured as a base station (or part of a base station), the bursty interference and puncturing detection module 605 may be used to identify that puncturing or other bursty interference is affecting transmitted communications. For example, if the device 505-a is configured as a base station and is involved in nominal and mission critical multiplexing, then the bursty interference and puncturing detection module 605 may be aware of mission critical puncturing that may impact downlink transmissions to a UE. Alternatively, the bursty interference and puncturing detection module 605 may be used to receive and evaluate feedback information received from a UE, wherein the feedback information may convey to the device 505-a that communications with the UE are subject to bursty interference or puncturing. The feedback information may be in the form of CSI, and may include metrics such as spectrum efficiency, bursty puncturing duty cycle, and/or interference level. The feedback information may also be in the form of FEC and HARQ signals, requesting retransmission of specific CBs, for example.

The bursty interference and puncturing protection module 610 may be used by the device 505-a to apply one or more protection schemes to communications that may be subject to bursty interference or puncturing. The bursty interference and puncturing protection module 610 may be used when the device 505-a is configured as a base station (or as part of a base station). The protection schemes applied by the bursty interference and puncturing protection module 610 may be applied after analysis of information identified by the bursty interference and puncturing detection module 605. For example, a protection scheme may be selected based on a long-term average of historical information pertaining to communications subject to puncturing or bursty interference (such as puncturing/interference duty cycle, spatial direction, etc.). Alternatively, a protection scheme may be selected based on an instantaneous snap-shot of puncturing or bursty interference, as detected of a most recent transmission to a UE. The instantaneous snap-shot may be based on CSI or FEC and HARQ signals received from a UE, or may be based on an analysis performed by the device 505-a itself. The bursty interference and puncturing protection module 610 may apply more than one protection scheme to a given communication, based at least in part on the detected bursty interference or puncturing.

One protection scheme may be applied by the time and frequency interleaving module 615. The time and frequency interleaving module 615 may be used to apply two-dimensional interleaving of CBs within a TB. The bits of each CB within a TB may be interleaved in both a time domain and a frequency domain. This two-dimensional interleaving provides time-frequency interference diversity.

Another protection scheme, such as in addition to time-frequency interleaving, may be applied by the MCS and coding rate module 620. The MCS and coding rate module 620 may be used to vary the modulation and coding rate applied to a communication, based on whether stationary interference or bursty interference or puncturing has been detected. If only stationary interference has been detected, a low modulation (such as 16QAM) and a moderate coding rate (such as 1/2) may be applied. However, if bursty interference or puncturing is detected, a high modulation (such as 256QAM) and a low coding rate (such as 1/4) may be applied. Additionally, other parameters may be adjusted in order to result in an overall higher nominal data spectrum efficiency in the presence of puncturing or bursty interference. For example, if bursty interference or puncturing is detected, an RI of the communications may be updated to increase spatial diversity or change spatial direction to better combat bursty interference or puncturing. A PMI may also be adjusted so as to favor a higher overall nominal data spectrum efficiency in the presence of bursty (mission critical) interference or puncturing.

Another protection scheme may be applied by the LDPC code module 625. The LDPC code module 625 may be used to apply LDPC code to communications that may be subject to bursty interference or puncturing. LDPC code is known to be more robust than turbo code to puncturing. Thus, whereas turbo code may be used in cases of stationary interference, LDPC code may be preferable in cases of bursty interference or puncturing.

Figure 7:
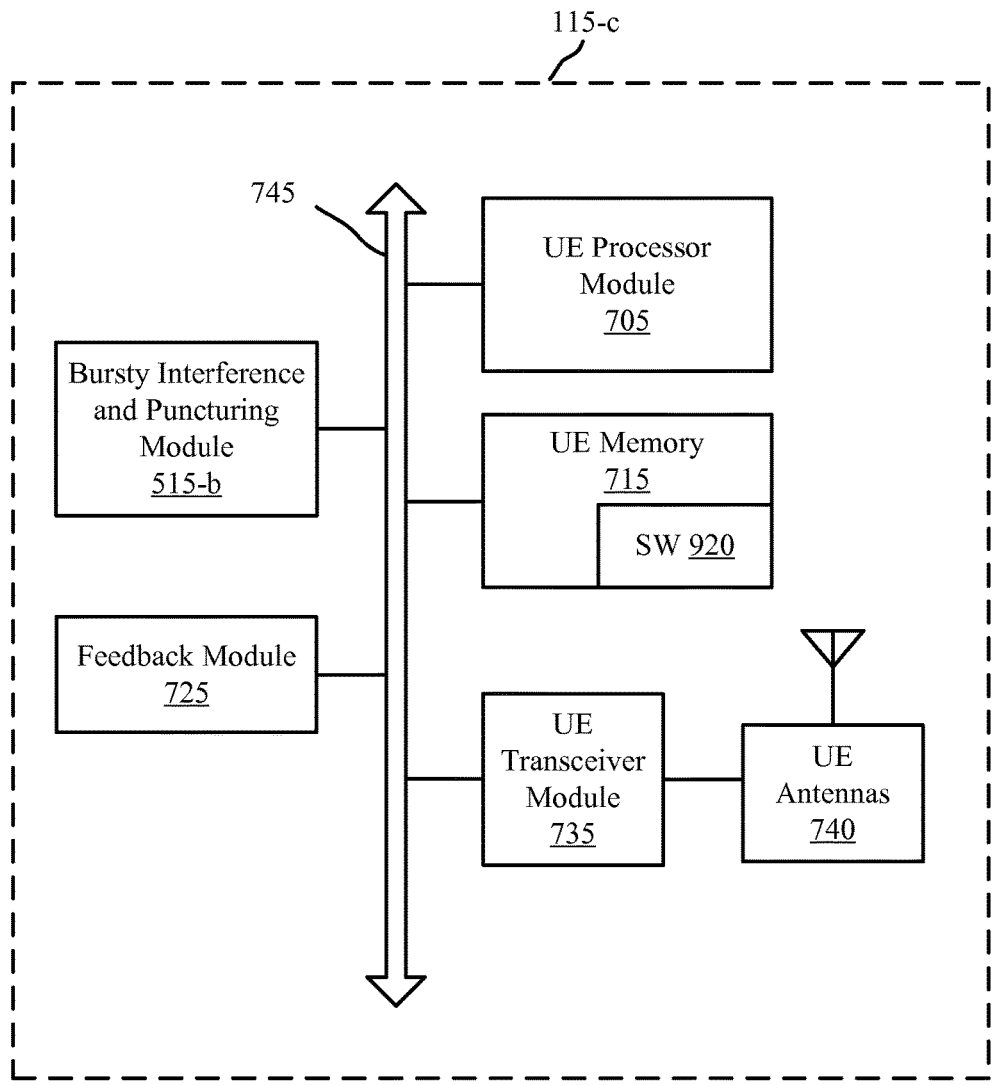
FIG. 7 shows a block diagram of a user equipment (UE) for use in wireless communication, in accordance with various aspects of the present disclosure.

FIG. 7 shows a system 700 for use in wireless communication, in accordance with various examples. System 700 may include a UE 115-c, which may be an example of the UEs 115 described in connection with FIGS. 1-4. UE 115-c may also be an example of one or more aspects of devices 505 of FIGS. 5 and 6 when devices 505 are configured as a UE (or as part of a UE).

The UE 115-c may generally include components for bi-directional voice and data communications including components for transmitting communications and components for receiving communications. The UE 115-c may include UE antenna(s) 740, a UE transceiver module 735, a UE processor module 705, and UE memory 715 (including software (SW) 720), which each may communicate, directly or indirectly, with each other (e.g., via one or more buses 745). The UE transceiver module 735 may be configured to communicate bi-directionally, via the UE antenna(s) 740 and/or one or more wired or wireless links, with one or more networks, as described above. For example, the UE transceiver module 735 may be configured to communicate bi-directionally with base stations 105 with reference to FIGS. 1-4. The UE transceiver module 735 may include a modem configured to modulate the packets and provide the modulated packets to the UE antenna(s) 740 for transmission, and to demodulate packets received from the UE antenna(s) 740. While the UE 115-c may include a single UE antenna 740, the UE 115-c may have multiple UE antennas 740 capable of concurrently transmitting and/or receiving multiple wireless transmissions. The UE transceiver module 735 may be capable of concurrently communicating with one or more base stations 105 via multiple component carriers.

The UE 115-c may include a bursty interference and puncturing module 515-b, which may perform the functions described above for the bursty interference and puncturing modules 515 of device 505 of FIGS. 5 and 6. The UE 115-c may also include a feedback module 725. The feedback module 725 may be configured to generate and/or transmit feedback to a serving base station 105 if communications received by the UE 115-c are subject to bursty interference or puncturing. For example, the feedback module 725 may be used to generate and transmit CSI that includes spectrum efficiency metrics, bursty puncturing duty cycle metrics, and/or interference level metrics. The feedback module 725 may also be used to generate and transmit FEC and HARQ signals requesting retransmission of CBs. The feedback module 725 may function using information detected by the bursty interference and puncturing module 515-b, and may also cooperate with the UE transceiver module 735.

The UE memory 715 may include random access memory (RAM) and read-only memory (ROM). The UE memory 715 may store computer-readable, computer-executable software/firmware code 720 containing instructions that are configured to, when executed, cause the UE processor module 705 to perform various functions described herein (e.g., identify bursty interference and puncturing in received communications and provide feedback regarding the same to serving base stations, etc.). Alternatively, the computer-readable, computer-executable software/firmware code 720 may not be directly executable by the UE processor module 705 but be configured to cause a computer (e.g., when compiled and executed) to perform functions described herein. The UE processor module 705 may include an intelligent hardware device, e.g., a central processing unit (CPU), a microcontroller, an ASIC, etc.

Figure 8:
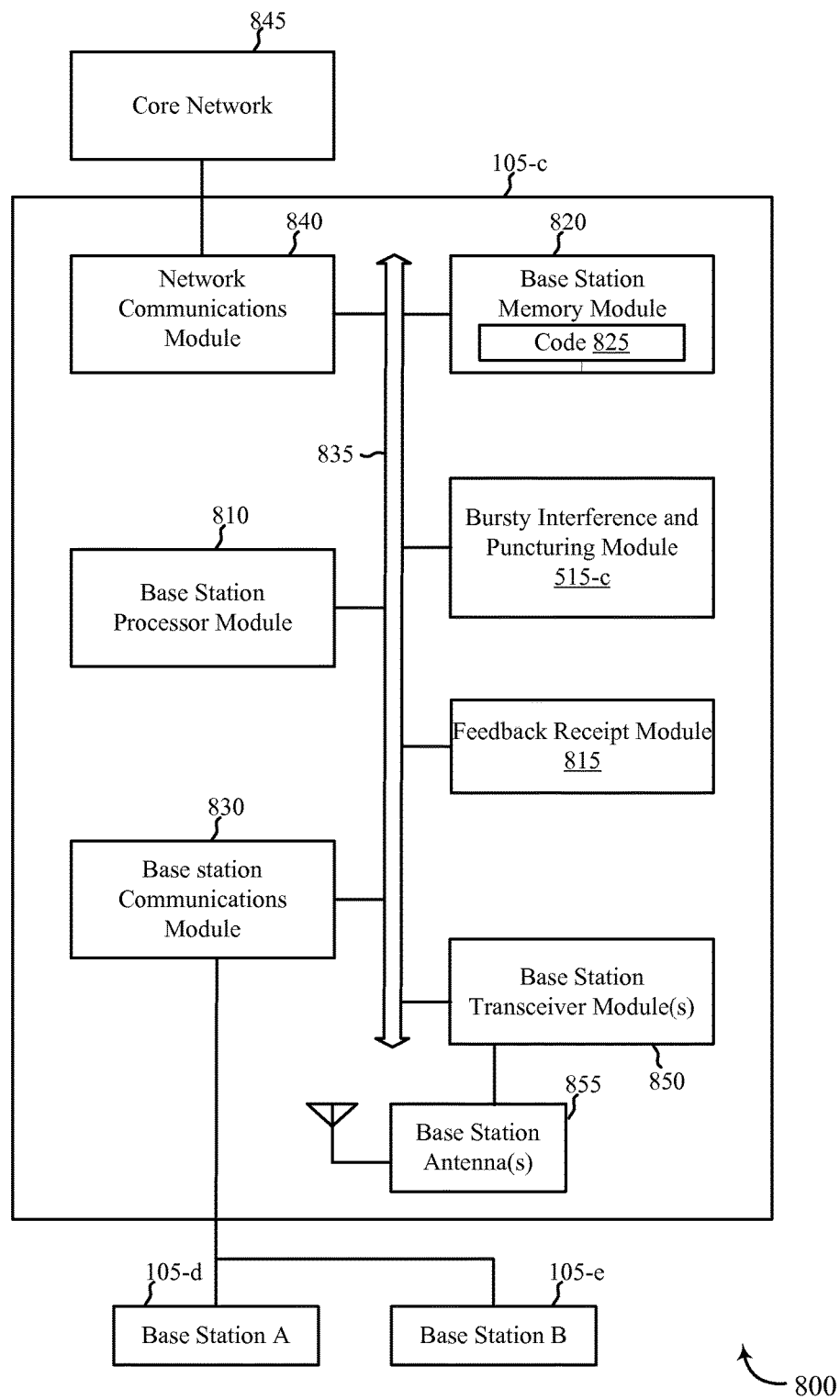
FIG. 8 shows a block diagram of a base station for use in wireless communication, in accordance with various aspects of the present disclosure.

FIG. 8 shows a block diagram 800 of a base station 105-c (e.g., a base station forming part or all of an eNB) for use in wireless communication, in accordance with various aspects of the present disclosure. In some examples, the base station 105-c may be an example of aspects of one or more of the base stations 105 described with reference to FIGS. 1-4, and/or aspects of one or more of the devices 505 when configured as a base station, as described with reference to FIGS. 5 and/or 6. The base station 105-c may be configured to implement or facilitate at least some of the base station and/or device features and functions described with reference to FIGS. 1-6.

The base station 105-c may include a base station processor module 810, a base station memory module 820, at least one base station transceiver module (represented by base station transceiver module(s) 850), at least one base station antenna (represented by base station antenna(s) 855), and/or a bursty interference and puncturing module 515-c. The base station 105-c may also include one or more of a base station communications module 830 and/or a network communications module 840. Each of these modules may be in communication with each other, directly or indirectly, over one or more buses 835.

The base station memory module 820 may include RAM and/or ROM. The base station memory module 820 may store computer-readable, computer-executable software/firmware code 825 containing instructions that are configured to, when executed, cause the base station processor module 810 to perform various functions described herein related to wireless communication (e.g., to detect communications that may be subject to bursty interference or puncturing, and to protect communications from bursty interference or and puncturing, etc.). Alternatively, the computer-readable, computer-executable software/firmware code 825 may not be directly executable by the base station processor module 810 but be configured to cause the base station 805 (e.g., when compiled and executed) to perform various of the functions described herein.

The base station processor module 810 may include an intelligent hardware device, e.g., a CPU, a microcontroller, an ASIC, etc. The base station processor module 810 may process information received through the base station transceiver module(s) 850, the base station communications module 830, and/or the network communications module 840. The base station processor module 810 may also process information to be sent to the base station transceiver module(s) 850 for transmission through the base station antenna(s) 855, to the base station communications module 830, for transmission to one or more other base stations 105-d and 105-e, and/or to the network communications module 840 for transmission to a core network 845, which may be an example of one or more aspects of the core network 130 described with reference to FIG. 1. The base station processor module 810 may handle, alone or in connection with the bursty interference and puncturing module 515-c, various aspects of detecting and protecting communications from bursty interference or puncturing.

The base station transceiver module(s) 850 may include a modem configured to modulate packets and provide the modulated packets to the base station antenna(s) 855 for transmission, and to demodulate packets received from the base station antenna(s) 855. The base station transceiver module(s) 850 may, in some examples, be implemented as one or more base station transmitter modules and one or more separate base station receiver modules. The base station transceiver module(s) 850 may support communications in a first radio frequency spectrum band and/or a second radio frequency spectrum band. The base station transceiver module(s) 850 may be configured to communicate bi-directionally, via the base station antenna(s) 855, with one or more UEs or apparatuses, such as one or more of the UEs 115 described with reference to FIG. 1-4 or 7. The base station 105-c may, for example, include multiple base station antennas 855 (e.g., an antenna array). The base station 105-c may communicate with the core network 845 through the network communications module 840. The base station 105-*c* may also communicate with other base stations, such as the base stations 105-*d* and 105-*e*, using the base station communications module 830.

The bursty interference and puncturing module 515-*c* may be configured to perform and/or control some or all of the features and/or functions described with reference to FIGS. 5 and/or 6 related to detecting and protecting communications subject to bursty interference or puncturing. In some examples, the bursty interference and puncturing module 515-*c* may be used to detect bursty interference or puncturing in communications. This may be accomplished through a module such as the bursty interference and puncturing detection module 605 described with relation to FIG. 6. Additionally, the bursty interference and puncturing module 515-*c* may work in conjunction with a feedback receipt module 815 to detect bursty interference or puncturing via feedback received from a UE. The feedback may be received as CSI metrics or as FEC and HARQ signals, for example. The bursty interference and puncturing module 515-*c* may also be used to apply a protection scheme to communications that may be subject to bursty interference or puncturing. The bursty interference and puncturing module 515-*c*, or portions of the bursty interference and puncturing module 515-*c*, may include a processor, and/or some or all of the functions of the bursty interference and puncturing module 515-*c* may be performed by the base station processor module 810 and/or in connection with the base station processor module 810. In some examples, the bursty interference and puncturing module 515-*c* may be an example of the bursty interference and puncturing module 515 and/or 515-*a* described with reference to FIGS. 5 and/or 6 when device 505 is configured as a base station.

Figure 9:
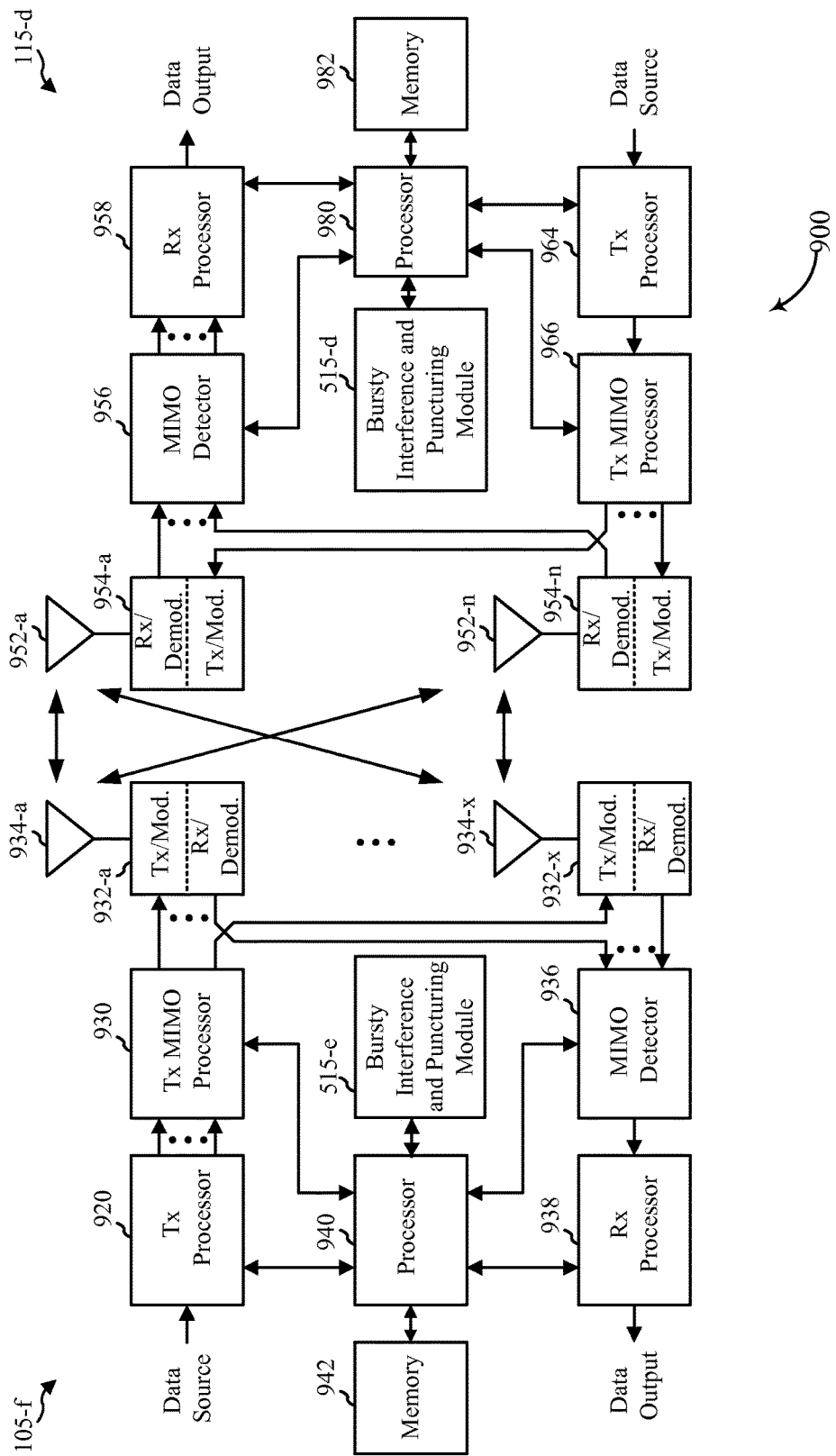
FIG. 9 shows a block diagram of a multiple-input/multiple-output (MIMO) communication system, in accordance with various aspects of the present disclosure.

FIG. 9 is a block diagram of a multiple input/multiple output (MIMO) communications system 900 including a base station 105-*f* and a UE 115-*d*. The MIMO communications system 900 may illustrate aspects of the wireless communications system 100 shown in FIG. 1. The base station 105-*f* may be equipped with antennas 934-*a* through 934-*x*, and the UE 115-*d* may be equipped with antennas 952-*a* through 952-*n*. In the MIMO communications system 900, the base station 105-*f* may be able to send data over multiple communication links at the same time. Each communication link may be called a "layer" and the "rank" of the communication link may indicate the number of layers used for communication. For example, in a 2×2 MIMO communications system where base station 105-*f* transmits two "layers," the rank of the communication link between the base station 105-*f* and the UE 115-*d* is two.

At the base station 105-*f*, a transmit processor 920 may receive data from a data source. The transmit processor 920 may process the data. The transmit processor 920 may also generate control symbols and/or reference symbols. A transmit (TX) MIMO processor 930 may perform spatial processing (e.g., precoding) on data symbols, control symbols, and/or reference symbols, if applicable, and may provide output symbol streams to the modulator/demodulators 932-*a* through 932-*x*. Each modulator/demodulator 932 may process a respective output symbol stream (e.g., for orthogonal frequency-division multiple access (OFDM), etc.) to obtain an output sample stream. Each modulator/demodulator 932 may further process (e.g., convert to analog, amplify, filter, and upconvert) the output sample stream to obtain a DL signal. In one example, DL signals from modulator/demodulators 932-*a* through 932-*x* may be transmitted via the antennas 934-*a* through 934-*x*, respectively.

At the UE 115-*d*, the UE antennas 952-*a* through 952-*n* may receive the DL signals from the base station 105-*f* and may provide the received signals to the modulator/demodulators 954-*a* through 954-*n*, respectively. Each modulator/demodulator 954 may condition (e.g., filter, amplify, downconvert, and digitize) a respective received signal to obtain input samples. Each modulator/demodulator 954 may further process the input samples (e.g., for OFDM, etc.) to obtain received symbols. A MIMO detector 956 may obtain received symbols from all the modulator/demodulators 954-*a* through 954-*n*, perform MIMO detection on the received symbols, if applicable, and provide detected symbols. A receive processor 958 may process (e.g., demodulate, deinterleave, and decode) the detected symbols, providing decoded data for the UE 115-*d* to a data output, and provide decoded control information to a processor 980, or memory 982.

The processor 980 may in some cases execute stored instructions to instantiate one or more of a bursty interference and puncturing module 515-*d*. The bursty interference and puncturing module 515-*d* may be an example of aspects of the bursty interference and puncturing module 515 described with reference to FIGS. 5-7.

On the uplink, at the UE 115-*d*, a transmit processor 964 may receive and process data from a data source. The transmit processor 964 may also generate reference symbols for a reference signal. The symbols from the transmit processor 964 may be precoded by a transmit MIMO processor 966 if applicable, further processed by the modulator/demodulators 954-*a* through 954-*n* (e.g., for single-carrier frequency-division multiple access (SC-FDMA), etc.), and be transmitted to the base station 105-*f* in accordance with the transmission parameters received from the base station 105-*f*. At the base station 105-*f*, the UL signals from the UE 115-*d* may be received by the antennas 934, processed by the modulator/demodulators 932, detected by a MIMO detector 936 if applicable, and further processed by a receive processor 938. The receive processor 938 may provide decoded data to a data output and to the processor 940 and/or memory 942. The processor 940 may in some cases execute stored instructions to instantiate one or more of a bursty interference and puncturing module 515-*e*. The bursty interference and puncturing module 515-*e* may be an example of aspects of the bursty interference and puncturing module 515 described with reference to FIGS. 5, 6, and/or 8.

The components of the UE 115-*d* may, individually or collectively, be implemented with one or more ASICs adapted to perform some or all of the applicable functions in hardware. Each of the noted modules may be a means for performing one or more functions related to operation of the MIMO communications system 900. Similarly, the components of the base station 105-*f* may, individually or collectively, be implemented with one or more ASICs adapted to perform some or all of the applicable functions in hardware. Each of the noted components may be a means for performing one or more functions related to operation of the MIMO communications system 900.

Figure 10:
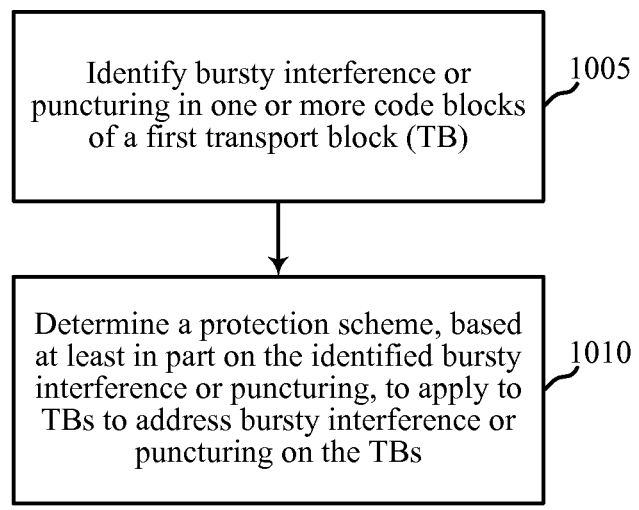
FIGS. 10-12 are flow charts illustrating examples of methods for wireless communication, in accordance with various aspects of the present disclosure.

FIG. 10 is a flow chart illustrating an example of a method 1000 for wireless communication, in accordance with various aspects of the present disclosure. For clarity, the method 1000 is described below with reference to aspects of one or more of either the UEs 115 or the base stations 105 described with reference to FIG. 1-4 or 7-9, and/or aspects of one or more of the devices described with reference to FIG. 5 or 6. In some examples, a UE or base station may execute one or more sets of codes to control the functional elements of the UE or base station to perform the functions described below.

Additionally or alternatively, the UE or base station may perform one or more of the functions described below using special-purpose hardware.

At block 1005, the method 1000 may include identifying bursty interference or puncturing in one or more code blocks of a first TB. The identification of bursty interference may be performed by either a UE or a base station. A UE may identify that it has received a communication subject to bursty interference or puncturing. A base station may identify that it is involved in mission critical and nominal traffic multiplexing and thus may be aware that communications are being punctured. Additionally, a base station may receive feedback from a UE indicating that communications to the UE are subject to bursty interference or puncturing.

The operations at block 1005 may be performed using the bursty interference and puncturing module 515 described with reference to FIG. 5 or 6, or using the bursty interference and puncturing detection module 605 described with reference to FIG. 6.

At block 1010, the method 1000 may include determining a protection scheme, based at least in part on the identified bursty interference or puncturing, to apply to TBs to address bursty interference or puncturing on the TBs. The applied protection scheme may include any one or more of using two-dimensional time domain and frequency domain interleaving of code blocks in TBs, applying different combinations of MCS and coding rates to TBs subject to bursty interference or puncturing, or applying universal LDPC code to TB transmissions.

The operations at block 1010 may be performed using the bursty interference and puncturing module 515 described with reference to FIG. 5 or 6, or using the bursty interference and puncturing protection module 610 described with reference to FIG. 6.

Thus, the method 1000 may provide for wireless communication. It should be noted that the method 1000 is just one implementation and that the operations of the method 1000 may be rearranged or otherwise modified such that other implementations are possible.

Figure 11:
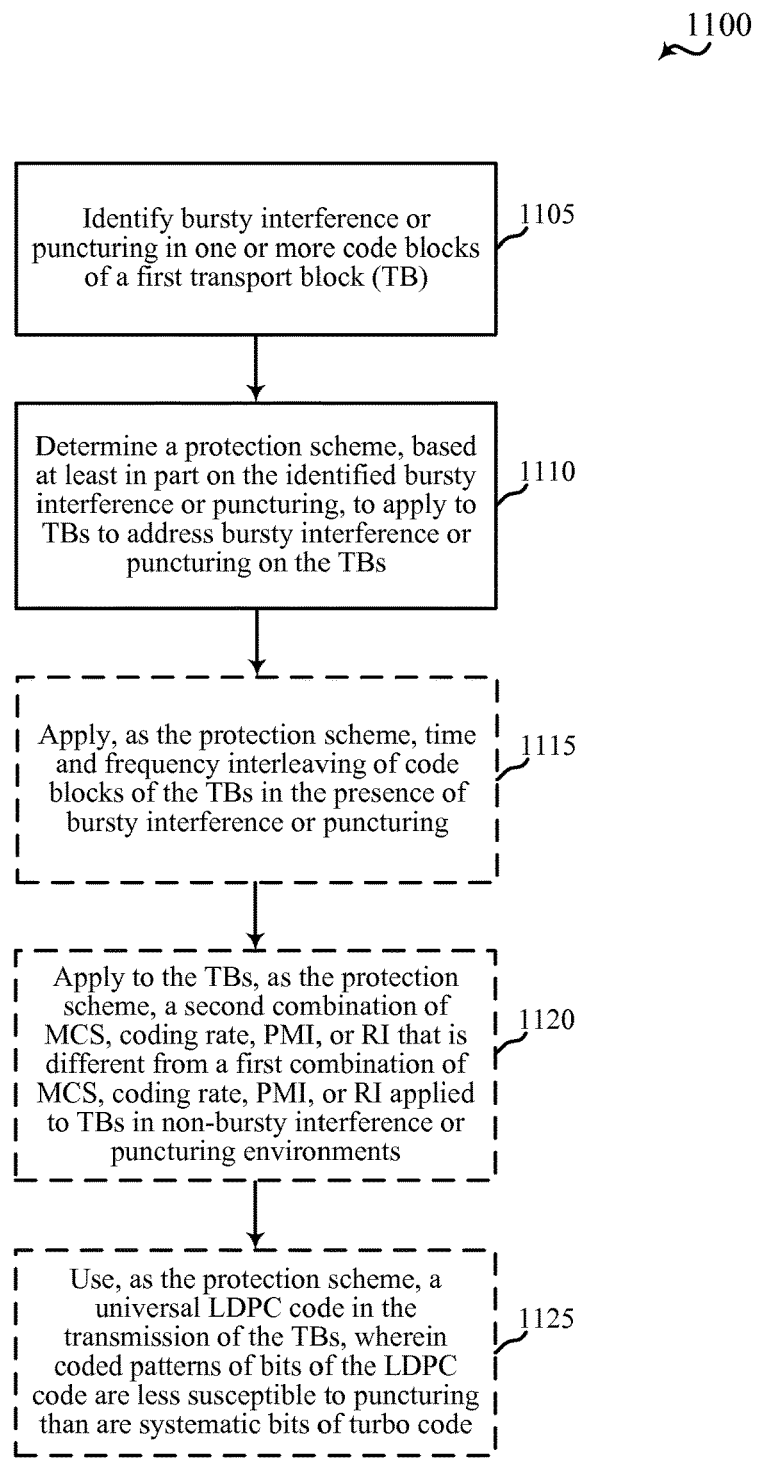

FIG. 11 is a flow chart illustrating an example of a method 1100 for wireless communication, in accordance with various aspects of the present disclosure. For clarity, the method 1100 is described below with reference to aspects of one or more of the base stations 105 described with reference to FIG. 1-4 or 7-9, and/or aspects of one or more of the devices described with reference to FIG. 5 or 6. In some examples, a base station may execute one or more sets of codes to control the functional elements of the base station to perform the functions described below. Additionally or alternatively, the base station may perform one or more of the functions described below using special-purpose hardware.

At block 1105, the method 1100 may include identifying bursty interference or puncturing in one or more code blocks of a first TB. A base station may identify that it is involved in mission critical and nominal traffic multiplexing and thus may be aware that communications are being punctured. Additionally, a base station may receive feedback from a UE indicating that communications to the UE are subject to bursty interference or puncturing.

The operations at block 1105 may be performed using the bursty interference and puncturing module 515 described with reference to FIG. 5 or 6, or using the bursty interference and puncturing detection module 605 described with reference to FIG. 6.

At block 1110, the method 1100 may include determining a protection scheme, based at least in part on the identified bursty interference or puncturing, to apply to TBs to address bursty interference or puncturing on the TBs. The applied protection scheme may include any one or more of using two-dimensional time domain and frequency domain interleaving of code blocks in TBs, applying different combinations of MCS, coding rates, PMI, or RI to TBs subject to bursty interference or puncturing, or applying universal LDPC code to TB transmissions.

The operations at block 1110 may be performed using the bursty interference and puncturing module 515 described with reference to FIG. 5 or 6, or using the bursty interference and puncturing protection module 610 described with reference to FIG. 6.

Blocks 1115, 1120, and 1125 represent different types of protection schemes that may be applied to TB transmissions. At block 1115, the method 1100 may include applying, as the protection scheme, time and frequency interleaving of code blocks of the TBs in the presence of bursty interference or puncturing. The operations at block 1115 may be performed using the time and frequency interleaving module 615 described with reference to FIG. 6.

At block 1120, the method 1100 may include applying to the TBs, as the protection scheme, a second combination of MCS, coding rate, PMI, or RI that is different from a first combination of MCS, coding rate, PMI, or RI applied to TBs in non-bursty interference or puncturing environments. The second combination of MCS, coding rate, PMI, or RI may generally include modulations that are higher than those used in the first combination. The second combination of MCS, coding rate, PMI, or RI may generally include coding rates that are lower than those used in the first combination. In some cases, the second combination of MCS, coding rate, PMI, or RI may increase spatial diversity or spatial nulling compared to those of the first combination, or may have a higher overall nominal data spectrum efficiency or a different spatial direction. The operations at block 1120 may be performed using the MCS and coding rate module 620 described with reference to FIG. 6.

At block 1125, the method 1100 may include using, as the protection scheme, a universal LDPC code in the transmission of the TBs, wherein coded patterns of bits of the LDPC code are less susceptible to puncturing than are systematic bits of turbo code. The operations at block 1125 may be performed using the LDPC code module 625 described with reference to FIG. 6

Thus, the method 1100 may provide for wireless communication. It should be noted that the method 1100 is just one implementation and that the operations of the method 1100 may be rearranged or otherwise modified such that other implementations are possible.

Figure 12:
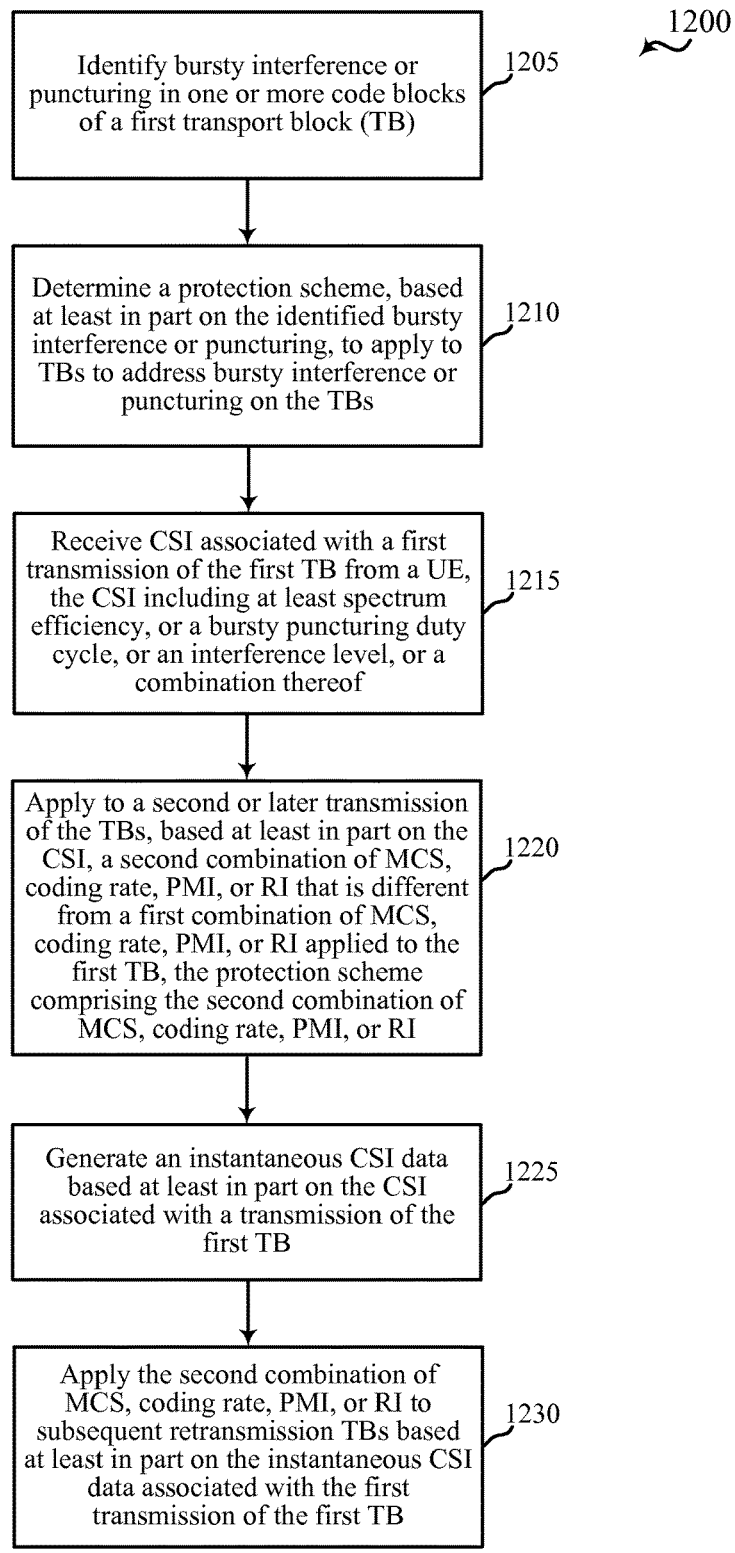

FIG. 12 is a flow chart illustrating an example of a method 1200 for wireless communication, in accordance with various aspects of the present disclosure. For clarity, the method 1200 is described below with reference to aspects of one or more of the base stations 105 described with reference to FIG. 1-4 or 7-9, and/or aspects of one or more of the devices described with reference to FIG. 5 or 6. In some examples, a base station may execute one or more sets of codes to control the functional elements of the base station to perform the functions described below. Additionally or alternatively, the base station may perform one or more of the functions described below using special-purpose hardware.

At block 1205, the method 1200 may include identifying bursty interference or puncturing in one or more code blocks of a first TB. A base station may identify that it is involved in mission critical and nominal traffic multiplexing and thus may be aware that communications are being punctured. Additionally, a base station may receive feedback from a UE indicating that communications to the UE are subject to bursty interference or puncturing.

The operations at block 1205 may be performed using the bursty interference and puncturing module 515 described with reference to FIG. 5 or 6, or using the bursty interference and puncturing detection module 605 described with reference to FIG. 6.

At block 1210, the method 1200 may include determining a protection scheme, based at least in part on the identified bursty interference or puncturing, to apply to TBs to address bursty interference or puncturing on the TBs. The applied protection scheme may include any one or more of using two-dimensional time domain and frequency domain interleaving of code blocks in TBs, applying different combinations of MCS and coding rates to TBs subject to bursty interference or puncturing, or applying universal LDPC code to TB transmissions.

The operations at block 1210 may be performed using the bursty interference and puncturing module 515 described with reference to FIG. 5 or 6, or using the bursty interference and puncturing protection module 610 described with reference to FIG. 6.

At block 1215, the method 1200 may include receiving CSI associated with a first transmission of the first TB from a UE, the CSI including at least spectrum efficiency, or a bursty puncturing duty cycle, or an interference level, or interference spatial direction, or a combination thereof. The operations at block 1215 may be performed using the feedback receipt module 815 described with reference to FIG. 8.

At block 1220, the method 1200 may include applying to a second or later transmission of the TBs, based at least in part on the CSI, a second combination of MCS, coding rate, PMI, or RI that is different from a first combination of MCS, coding rate, PMI, or RI applied to the first TB, the protection scheme comprising the second combination of MCS, coding rate, PMI, or RI. The second combination of MCS, coding rate, PMI, or RI may generally include modulations that are higher than those used in the first combination. The second combination of MCS, coding rate, PMI, or RI may generally include coding rates that are lower than those used in the first combination. In some cases, the second combination of MCS, coding rate, PMI, or RI may increase spatial diversity or spatial nulling compared to those of the first combination, or may have a higher overall nominal data spectrum efficiency or a different spatial direction. The operations at block 1220 may be performed using the MCS and coding rate module 620 described with reference to FIG. 6.

At block 1225, the method 1200 may include generating an instantaneous CSI data based at least in part on the CSI associated with a transmission of the first TB. This may allow a base station to iteratively apply a protection scheme without considering long-term CSI data, but instead using primarily the CSI data associated with the first transmission of the first TB. The operations at block 1225 may be performed using the bursty interference and puncturing protection module 610 described with reference to FIG. 6.

At block 1230, the method 1200 may include applying the second combination of MCS, coding rate, PMI, or RI to subsequent retransmission TBs based at least in part on the instantaneous CSI data associated with the first transmission of the first TB. The subsequently retransmitted TBs may be shorter than the transmission of the first TB as the retransmitted TBs may be limited to only those code blocks requiring retransmission. The operations at block 1230 may be performed using the bursty interference and puncturing protection module 610 described with reference to FIG. 6.

Thus, the method 1200 may provide for wireless communication. It should be noted that the method 1200 is just one implementation and that the operations of the method 1200 may be rearranged or otherwise modified such that other implementations are possible.

In some examples, aspects from two or more of the methods 1000-1200 may be combined. It should be noted that the methods 1000, 1100, 1200 are just example implementations, and that the operations of the methods 1000-1200 may be rearranged or otherwise modified such that other implementations are possible.

Techniques described herein may be used for various wireless communications systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (WiFi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over an unlicensed and/or shared bandwidth. The description above, however, describes an LTE/LTE-A system for purposes of example, and LTE terminology is used in much of the description above, although the techniques are applicable beyond LTE/LTE-A applications.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method for wireless communication, comprising:
   identifying puncturing by low latency communications from a base station in one or more code blocks of a first transport block (TB);
   determining, at the base station, a protection scheme, based at least in part on the identified puncturing, to apply to TBs to address puncturing on the TBs;
   applying, at the base station, the protection scheme to one or more TBs other than or in addition to the first TB by two-dimensionally interleaving code blocks of the one or more TBs in order to decrease a likelihood of retransmission of the one or more TBs; and
   transmitting, by the base station, the one or more TBs in accordance with the applied protection scheme.

2. The method of claim 1, wherein identifying puncturing comprises:
   identifying puncturing via base station analysis and signaling or via user equipment (UE) detection.

3. The method of claim 1, further comprising:
   applying, as the protection scheme, time and frequency interleaving of code blocks of TBs in response to puncturing from mission critical low latency users of a same serving base station or in response to bursty interference from mission critical low latency users of neighbor base stations or neighbor shared spectrum wireless networks.

4. The method of claim 1, further comprising:
   applying, as the protection scheme, time and frequency interleaving of code blocks of the TBs in a presence of puncturing.

5. The method of claim 1, further comprising:
   applying to the TBs, as the protection scheme, a second combination of modulation and coding scheme (MCS) and coding rate that is different from a first combination of MCS and coding rate applied to TBs in non-bursty interference or puncturing environments.

6. The method of claim 1, further comprising:
   using, as the protection scheme, a universal low-density parity check (LDPC) code in the transmission of the TBs, wherein coded patterns of bits of the universal LDPC code are less susceptible to puncturing than are systematic bits of turbo code.

7. The method of claim 1, further comprising:
   receiving channel state information (CSI) associated with a first transmission of the first TB from a user equipment (UE), the CSI including at least spectrum efficiency, or a bursty puncturing duty cycle, or an interference level, or a combination thereof.

8. The method of claim 7, further comprising:
   applying to a second or later transmission of the TBs, based at least in part on the CSI, a second combination of modulation and coding scheme (MCS) and coding rate that is different from a first combination of MCS and coding rate applied to the first TB, the protection scheme comprising the second combination of MCS and coding rate.

9. The method of claim 8, further comprising:
generating an instantaneous CSI data based at least in part on the CSI associated with a transmission of the first TB; and
applying the second combination of MCS and coding rate to subsequent retransmission TBs based at least in part on the instantaneous CSI data associated with the first transmission of the first TB.

10. The method of claim 1, further comprising:
applying to the TBs in a presence of puncturing, as the protection scheme, a second combination of modulation and coding scheme (MCS) and coding rate that is different from a first combination of MCS and coding rate applied to the TBs in an absence of puncturing, wherein a modulation of the second combination is higher order than a modulation of the first combination, and wherein the coding rate of the second combination is lower than a coding rate of the first combination.

11. The method of claim 1, further comprising:
applying to the TBs in a presence of puncturing, as the protection scheme, a second rank index (RI) that is different from a first RI applied to the TBs in an absence of puncturing.

12. The method of claim 1, further comprising:
applying to the TBs in a presence of puncturing, as the protection scheme, a second precoding matrix indicator (PMI) that is different from a first PMI applied to the TBs in an absence of puncturing, wherein the second PMI results in a higher overall nominal data spectrum efficiency in the presence of puncturing in one or more subsequent TBs.

13. The method of claim 1, further comprising:
using the protection scheme to protect the one or more code blocks of the first TB during retransmission to compensate for loss due to large-scale puncturing.

14. The method of claim 13, further comprising:
retransmitting less than all of the first TB to compensate for small-scale puncturing.

15. The method of claim 1, wherein identifying puncturing in one or more code blocks of a first TB comprises:
determining that low latency communications from a serving base station are puncturing the first TB via base station signaling or user equipment (UE) detection.

16. An apparatus for wireless communication, comprising:
means for identifying puncturing by low latency communications from a base station in one or more code blocks of a first transport block (TB);
means for determining, at the base station, a protection scheme, based at least in part on the identified puncturing, to apply to TBs to address puncturing on the TBs;
means for applying, at the base station, the protection scheme to one or more TBs other than or in addition to the first TB by two-dimensionally interleaving code blocks of the one or more TBs in order to decrease a likelihood of retransmission of the one or more TBs; and
means for transmitting, at the base station, the one or more TBs in accordance with the applied protection scheme.

17. The apparatus of claim 16, wherein the means for identifying puncturing comprises:
means for identifying puncturing via base station analysis and signaling or via user equipment (UE) detection.

18. The apparatus of claim 16, further comprising:
means for applying, as the protection scheme, time and frequency interleaving of code blocks of TBs in response to puncturing from mission critical low latency users of a same serving base station or in response to bursty interference from mission critical low latency users of neighbor base stations or neighbor shared spectrum wireless networks.

19. The apparatus of claim 16, further comprising:
means for applying, as the protection scheme, time and frequency interleaving of code blocks of the TBs in a presence of puncturing.

20. The apparatus of claim 16, further comprising:
means for applying to the TBs, as the protection scheme, a second combination of modulation and coding scheme (MCS) and coding rate that is different from a first combination of MCS and coding rate applied to TBs in non-bursty interference or puncturing environments.

21. The apparatus of claim 16, further comprising:
means for using, as the protection scheme, a universal low-density parity check (LDPC) code in the transmission of the TBs, wherein coded patterns of bits of the universal LDPC code are less susceptible to puncturing than are systematic bits of turbo code.

22. The apparatus of claim 16, further comprising:
means for receiving channel state information (CSI) associated with a first transmission of the first TB from a user equipment (UE), the CSI including at least spectrum efficiency, or a bursty puncturing duty cycle, or an interference level, or a combination thereof.

23. An apparatus for wireless communication, comprising:
a processor;
memory in electronic communication with the processor; and
instructions stored in the memory, the instructions being executable by the processor to:
identify puncturing by low latency communications from a base station in one or more code blocks of a first transport block (TB);
determine, at the base station, a protection scheme, based at least in part on the identified puncturing, to apply to TBs to address puncturing on the TBs;
apply, at the base station, the protection scheme to one or more TBs other than or in addition to the first TB by two-dimensionally interleaving code blocks of the one or more TBs in order to decrease a likelihood of retransmission of the one or more TBs; and
transmit, at the base station, the one or more TBs in accordance with the applied protection scheme.

24. The apparatus of claim 23, further comprising instructions executable by the processor to:
apply to the TBs in a presence of puncturing, as the protection scheme, a second combination of modulation and coding scheme (MCS) and coding rate that is different from a first combination of MCS and coding rate applied to the TBs in an absence of puncturing, wherein a modulation of the second combination is higher order than a modulation of the first combination, and wherein the coding rate of the second combination is lower than a coding rate of the first combination.

25. The apparatus of claim 23, further comprising instructions executable by the processor to:

apply to the TBs in a presence of puncturing, as the protection scheme, a second rank index (RI) that is different from a first RI applied to the TBs in an absence of puncturing.

26. The apparatus of claim 23, further comprising instructions executable by the processor to:
apply to the TBs in a presence of puncturing, as the protection scheme, a second precoding matrix indicator (PMI) that is different from a first PMI applied to the TBs in an absence of puncturing, wherein the second PMI results in a higher overall nominal data spectrum efficiency in the presence of puncturing.

27. The apparatus of claim 23, further comprising instructions executable by the processor to:
use the protection scheme to protect the one or more code blocks of the first TB during retransmission to compensate for loss due to large-scale puncturing.

28. A non-transitory computer-readable medium storing computer-executable code for wireless communication, the code executable by a processor to:
identify puncturing by low latency communications from a base station in one or more code blocks of a first transport block (TB);
determine, at the base station, a protection scheme, based at least in part on the identified puncturing, to apply to TBs to address puncturing on the TBs;
apply, at the base station, the protection scheme to one or more TBs other than or in addition to the first TB by two-dimensionally interleaving code blocks of the one or more TBs in order to decrease a likelihood of retransmission of the one or more TBs; and
transmit, at the base station, the one or more TBs in accordance with the applied protection scheme.

* * * * *